United States Patent [19]

Abe et al.

[11] Patent Number: 5,315,102

[45] Date of Patent: May 24, 1994

[54] DRIVING DEVICE AND METHOD FOR DRIVING TWO-DIMENSIONAL CONTACT IMAGE SENSOR

[75] Inventors: Tsutomu Abe, Kanagawa; Seigo Makida, Kanakawa; Kenichi Kobayashi, Kanagawa, all of Japan

[73] Assignee: Fuji Xerox Co., Ltd., Tokyo, Japan

[21] Appl. No.: 940,991

[22] Filed: Sep. 4, 1992

[30] Foreign Application Priority Data

Sep. 5, 1991 [JP] Japan .................. 3-252782

[51] Int. Cl.⁵ ........................................ H01L 27/46
[52] U.S. Cl. .................. 250/208.1; 348/302
[58] Field of Search ............. 250/208.1; 358/213.11, 358/213.15, 213.16, 213.31

[56] References Cited

U.S. PATENT DOCUMENTS

| | | | |
|---|---|---|---|
| 3,603,731 | 9/1971 | Weimer | 178/7.1 R |
| 3,696,250 | 10/1972 | Weimer | 250/220 M X |
| 5,160,836 | 11/1992 | Miyake | 250/208.1 |
| 5,182,447 | 1/1993 | Nakayama | 250/208.1 |
| 5,184,018 | 2/1993 | Conrads et al. | 250/208.1 X |

FOREIGN PATENT DOCUMENTS 57-115880(A) 7/1957 Japan .
64-62980(A) 3/1989 Japan .

Primary Examiner—David C. Nelms
Assistant Examiner—John R. Lee
Attorney, Agent, or Firm—Finnegan, Henderson, Farabow, Garrett & Dunner

[57] ABSTRACT

A driving device for driving a two-dimensional contact image sensor comprising a plurality of pixel forming light-receiving elements that are arranged in a two-dimensional matrix in both main scanning and frame scan directions, charge transfer switching elements for respective pixels that are individually connected to said light-receiving elements and which transfer the charges generated in said light-receiving elements, gate lines that are common to said charge transfer switching elements for respective pixels in the main scanning direction, and data lines that are connected to said charge transfer switching elements for respective pixels and which are common thereto in the frame scan direction, said driving device carrying out a plurality of pre-scans cycle on the same image without producing an output image signal and, thereafter, scanning the image to produce an output image signal. Whereby, imagelags that would otherwise occur in the frame scan direction are eliminated to enable the production of correct output image signals.

4 Claims, 9 Drawing Sheets

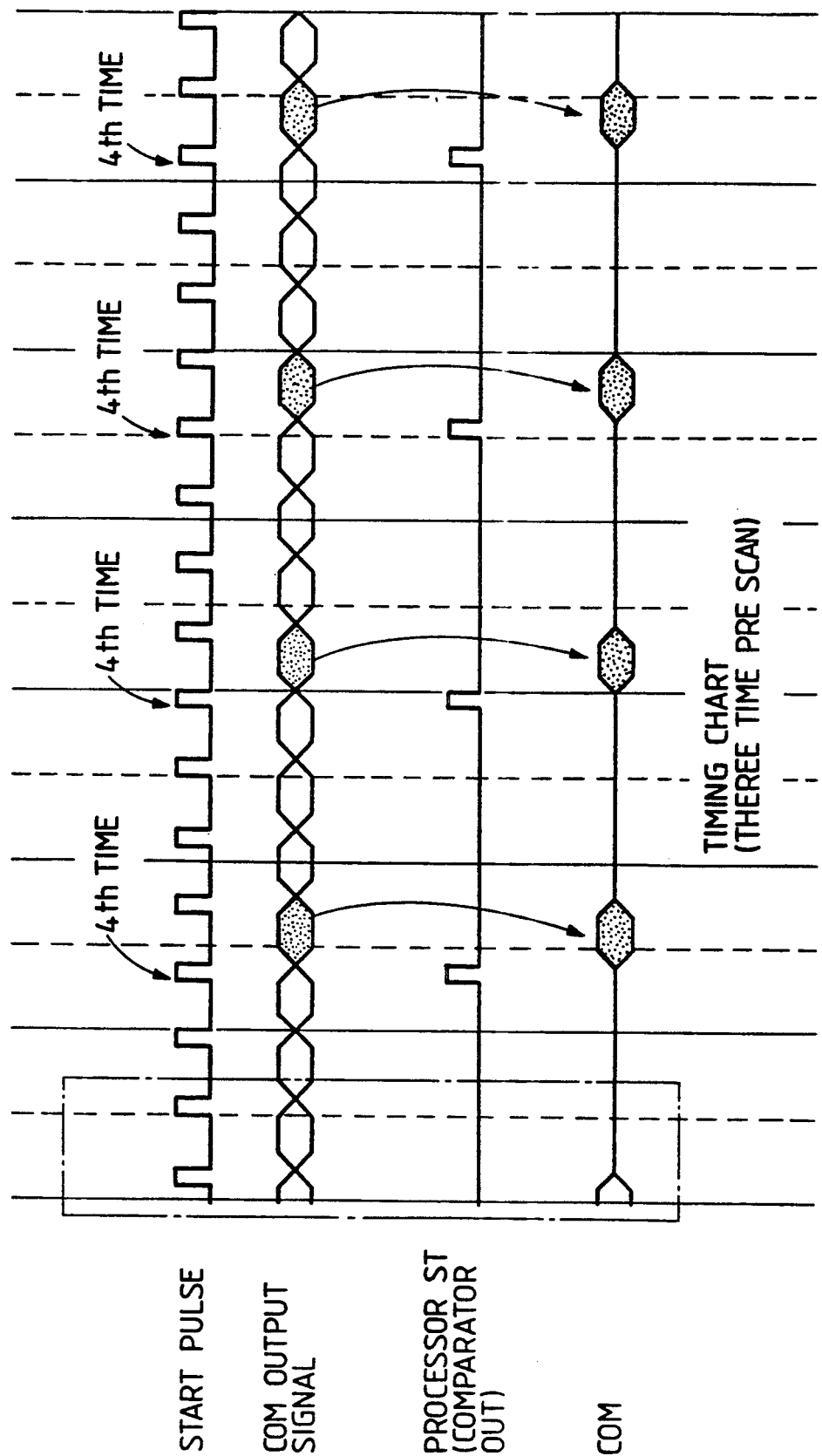

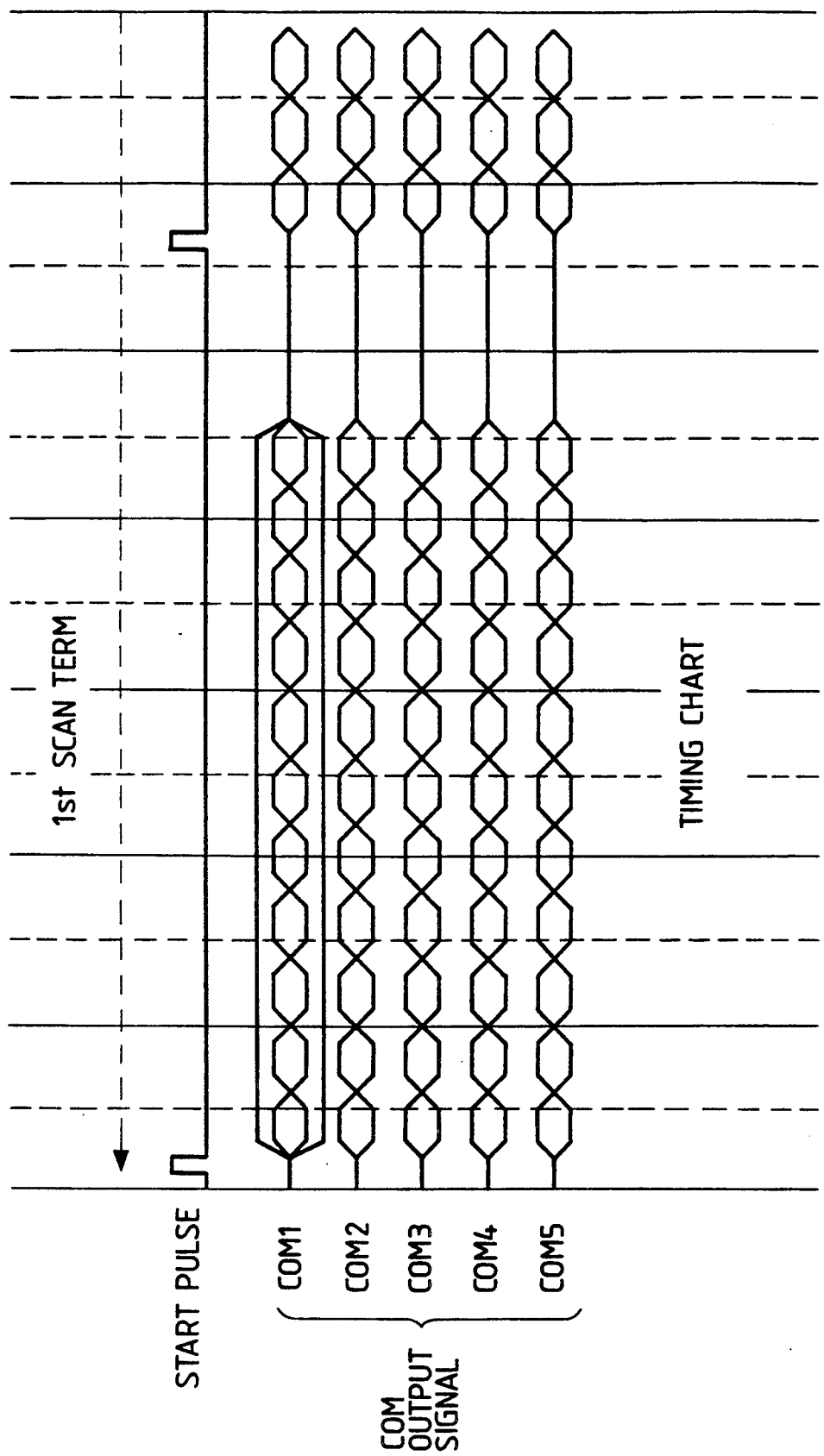
FIG. 11 TIMING CHART

DRIVING DEVICE AND METHOD FOR DRIVING TWO-DIMENSIONAL CONTACT IMAGE SENSOR

BACKGROUND OF THE INVENTION

1. Field of the Invention

The present invention relates to a two-dimensional contact image sensor that is to be used with a facsimile, a scanner or an optical character reader, etc. More particularly, the present invention relates to a driving device and method for a two-dimensional contact image sensor being capable of reducing the number of driving ICs and also being capable of reading the images accurately.

2. Description of the Conventional Art

A conventional two-dimensional contact image sensor is shown in FIG. 5 which is an equivalent circuit diagram of the sensor.

The sensor portion which is a structural unit of the image sensor that comprises a transparent substrate 1 having formed thereon a light-receiving element (photodiode) 2 which is a photoelectric transducer, a thin-film transistor (TFT) 3 which is a switching element, and a lighting portion. A plurality of such sensor portions are arranged in rows and columns in a two-dimensional matrix to form a sensing area.

The transparent electrode of the light-receiving element 2 in each sensor portion is connected to the drain electrode of the thin-film transistor 3. The gate electrodes of individual thin-film transistors are connected to a common gate line 13 for each row, which gate lines 13 being connected for each row to a shift register 7 which controls the turning on and off of the thin-film transistors for each row. The source electrodes of the thin-film transistors 3 are connected to a common data line 14 for each column, which data lines 14 in turn are connected to analog multiplexers 8 for reading in charges.

In the image sensor having the configuration described above, charges are generated in the light-receiving elements 2 in accordance to the quantity of reflected light from the document surface and, as the thin-film transistors 3 are turned on and off, the charges are transferred sequentially into the analog multiplexers 8 for each row, thence read out to produce output image signals (referring to Unexamined Published Japanese Patent Application No. 62980/1989).

In the conventional two-dimensional contact image sensor described above, the gate lines 13 which control TFTs for each row are provided in one-to-one correspondence with the terminals of the shift registers 7 and, hence, it has been necessary to provide as many terminals on the shift registers 7 as the gate lines 13. In addition, the charges generated in the sensor portions are to be read into the analog multiplexers 8 at a time by means of the operation of the common gate lines 13 and, hence, it also has been necessary to provide as many terminals on the analog multiplexers 8 as the data lines 14.

For example, in the case of a two-dimensional contact image sensor of an M×N matrix which consists of M gate lines and N data lines; if the number of terminals on a shift register is m whereas the number of terminals on an analog multiplexer is n, it is necessary to use at least M/n shift registers and at least N/n analog multiplexers.

If M≦n and N≦n, only one shift register and analog multiplexer need be used to compose a two-dimensional contact image sensor; however, if it is required to enlarge the sensing area in order to increase the reading range as in the case of M=10 m and N=10 n, it has been necessary to use ten each of shift registers and analog multiplexers, leading to a higher production cost.

Another problem with the conventional two-dimensional contact image sensor is that imagelags will be produced in the frame scan direction; this problem is discussed below on the basis of FIGS. 6 and 7 with reference to a method of driving an image sensor composed of photodiodes and thin-film transistors. It should be noted that the "capacitance division" which is described hereunder is just one major cause, and by no means the sole cause, of the occurrence of imagelags. The same explanation as given below will also hold for the case of an image sensor that is composed of photodiodes and blocking diodes.

FIG. 6 is an equivalent circuit diagram for one pixel in the image sensor of the type just described above, and FIG. 7 is a timing chart for photodetection from one pixel.

When light falls on a photodiode (PD) supplied with a reverse bias voltage ($V_B$), a photocurrent ip is generated and supplied to a photodiode capacity ($C_{PD}$), an added capacity ($C_{ADD}$) and the overlap capacity ($C_{GD}$) of a thin-film transistor (TFT), which capacities are all on the PD side. The charges stored for a predetermined time in the capacities on the PD side will turn on the TFT which is a switching element, whereby those charges are transferred to a signal line capacity ($C_L$) and the overlap capacity ($C_{GS}$) of TFT which are both capacities on the signal line side.

Signals are to be fed to the analog multiplexers with high impedance by voltage detection and, hence, all the charges generated are stored in the capacities in the Circuit. In other words, the charges are to be redistributed between the group of capacities on the PD side and the group of capacities on the signal line side. After detecting the potential ($V_L$) on the signal line side following the end of charge transfer, resetting of charges is effected with a reset switch in order to transfer the charges generated from the PDs in the next row.

The basic characteristics of charge transfer are described below with reference to Equations (1) to (7):

$$V_P = V_{PP} + \Delta V_P - \int_0^{T_{trans}} \frac{i_{ds}dt}{C_{PD} + C_{ADD} + C_{GD}} \quad (1)$$

$$V_L = V_{LO} + \Delta V_L + \int_0^{T_{trans}} \frac{i_{ds}dt}{C_L + C_{GS}} \quad (2)$$

$$\Delta V_P = \frac{C_{GD}}{C_{PD} + C_{ADD} + C_{GD}} (V_{GON} - V_{GOFF}) \quad (3)$$

$$\Delta V_L = \frac{C_{GS}}{C_L + C_{GS}} (V_{GON} - V_{GOFF}) \quad (4)$$

$$V_{PP} = V_{PO} + \int_0^{T_{storage}} \frac{i_p dt}{C_{PD} + C_{ADD} + C_{GD}} \quad (5)$$

$$i_p = F_1\{(V_B - V_{PP}), n_p\} \quad (6)$$

$$i_{ds} = F_2\{(V_P - V_L), V_G\} = F_2\{V_{DS}, V_G\} \quad (7)$$

where Ttrans denotes the transfer time; Tstorage, the storage time; $V_{PO}$ and $V_{LO}$, the potentials on the PD and signal line sides, respectively, at the time of resetting; np, the quantity of light; $V_P$, the potential on the PD side; and $V_L$, the potential on the signal line side. In terms of TFT, $V_P$ and $V_L$ correspond to the drain and source potentials, respectively, and they are related to the photocurrent ids expressed by Eq. (7).

$V_{PP}$ in Eq. (1) is expressed by Eq. (5) and it denotes the potential on the PD side just before charge transfer. $\Delta V_P$ and $\Delta V_L$ are expressed by Eqs. (3) and (4), respectively, and denote the potentials on the PD and signal line sides, respectively, which will increase on account of the feedthrough that develops when the gate of TFT turns on. $F_1$ and $F_2$ in Eqs. (6) and (7), respectively, are functions that denote $V_{PP}$, $V_P$ and $V_L$ which will vary with time and they are determined by PD and TFT characteristics.

Charge transfer is continued until $V_P$ becomes equal to $V_L$ across the TFT. If the quantity of stored charges on the PD side (Q0) and the quantity of transferred charges ($\Delta Q$) are considered while omitting the feedthrough, Equation (8) will be derived from Eqs. (1) and (2) taken in combination with the relationship $V_P = V_L$. The ratio, $\eta$, between the quantity of charges transferred to the signal line side and the quantity of stored charges on the PD side is expressed by Equation (9), and the proportion of charges left on the PD side, or the relative residual charges $\zeta$, is expressed by Equation (10). From the relationship between the photocurrent ip generated in the process of charge storage and the photocurrent ids flowing in the process of charge transfer, the ratio $\eta$ transient is obtained as expressed by Equation (11).

$$\frac{Q0 - \Delta Q}{C_{PD} + C_{ADD} + C_{GD}} = \frac{\Delta Q}{C_L + C_{GS}} \tag{8}$$

$$\eta = \frac{\Delta Q}{Q0} = \frac{C_L + C_{GS}}{C_{PD} + C_{ADD} + C_{GD} + C_L + C_{GS}} \tag{9}$$

$$\zeta = (1 - \eta) = \frac{C_{PD} + C_{ADD} + C_{GD}}{C_{PD} + C_{ADD} + C_{GD} + C_L + C_{GS}} \tag{10}$$

$$\eta\text{transient} = (1 - \zeta\text{transient}) = \frac{\int_0^{T\text{trans}} i_{ds} dt}{\int_0^{T\text{storage}} i_p dt} \tag{11}$$

The case of conducting plural scan cycle is described below using a simplified model of repeated "photo" and "dark" cycles, in which n scans are performed in an illuminated state ("photo"), followed by m scans in a non-illuminated state ("dark").

Suppose first the case of transition from the "dark" to "photo" state. The quantity of charges Q1 which are stored in the first scan cycle is expressed by $Q1 = Qp + Qi$, where Qp is the quantity of charges stored by one scan cycle and Qi is the quantity of residual charges that have been left before that scan is started. The quantity of charges transferred to the signal line side (QP1) as a result of the first scan and the quantity of charges left on the PD side (QR1) are expressed, respectively, by $QP1 = \eta Q1 = \eta(QP+Qi)$ and $QR1 = \zeta W1 = \zeta(QP+Qi)$.

If the same reasoning is applied to the second scan cycle, the quantity of stored charges (Q2), the quantity of transferred charges (QP2) and the quantity of residual charges (QR2) are expressed by the following equations, respectively:

$Q2 = QP + QR1 = (1 + \zeta)QP + \zeta Qi$
$QP2 = \eta((1 + \zeta)QP + \zeta Qi)$
$QR2 = \zeta((1 + \zeta)QP + \zeta Qi)$ In a similar manner, Qn, QPn and QRn for the nth scan cycle are respectively expressed by Equations (12), (13) and (14):

$$Q_n = \frac{1 - \zeta^n}{\eta} QP + \zeta^{n-1} Qi \tag{12}$$

$$QPn = \eta \left( \frac{1 - \zeta^n}{\eta} QP + \zeta^{n-1} Qi \right) \tag{13}$$

$$QRn = \zeta \left( \frac{1 - \zeta^n}{\eta} QP + \zeta^{n-1} Qi \right) \tag{14}$$

In the case of transition from the "photo" to "dark" state, the quantity of charges that have been stored on the PD side before charge transfer for the mth scan cycle is started is expressed by Equation (15). The quantity of charges transferred to the signal line side ($q_{Dm}$) as a result of the mth scan and the quantity of charges left on the PD side ($q_{Rm}$) are expressed by Equations (16) and (17), respectively:

$$q_m = \zeta^m \left( \frac{1 - \zeta^n}{\eta} QP + \zeta^{n-1} Qi \right) \tag{15}$$

$$q_{Dm} = \eta \zeta^m \left( \frac{1 - \zeta^n}{\eta} QP + \zeta^{n-1} Qi \right) \tag{16}$$

$$q_{Rm} = q_{m+1} \tag{17}$$

In the case where all scans are performed in the "photo" state, the quantity of charges stored on the PD side (Qp) is calculated by bringing n in Eq. (13) for Qpn to infinity (see Equation (18) below). In the case where all scans are performed in the "dark" state, the quantity of charges transferred to the signal line side ($q_D$) is calculated by bringing m and n in Eq (16) for $q_{Dm}$ to infinity and zero, respectively, and, hence, $q_D$ is expressed by Equation (19).

$$Q_p = \lim_{n \to \infty} \left( \eta \left( \frac{1 - \zeta^n}{\eta} Qp + \zeta^{n-1} Qi \right) \right) + Qp \tag{18}$$

$$q_D = \lim_{m \to \infty} q_{Dm} = \lim_{m \to \infty} \eta \zeta^m \left( \frac{1 - \zeta^n}{\eta} Qp + \zeta^{n-1} Qi \right) = 0$$

The ratio of capacitance division is calculated by normalizing with $Q_p$- $q_D$ the charges transferred to the signal line side in each scan cycle. The ratio of capacitance division for the case of "dark" to "photo" transition (imagelag Pn) is expressed by Equation (20) whereas the ratio of capacitance division for the case of "photo" to "dark" transition (imagelag dm) is expressed by Equation (21). The effects represented by Eqs. (20) and (21) are imagelags that develop in the frame scan direction.

$$\text{imagelag}_{Pn} = 1 - \zeta^n \tag{20}$$

$$\text{imagelag}_{dm} = \zeta^m(1 - \zeta^n) \tag{21}$$

Thus, the charges generated in light-receiving elements are redistributed by the ratios of capacitance on the side of light-receiving elements to capacitance on the signal line side and the charges remaining on the side of light-receiving elements will produce an image-lag. If the next document is read in the presence of residual charges, the generation of charges in response to the new document in addition to the already existing residual charges has made it impossible to produce correct image signals.

One of the methods that have heretofore been adopted to eliminate the production of imagelags in the frame scan direction due to residual charges comprises providing a reset TFT for each pixel, turning on the reset TFT after every scan so that the charges on the side of light-receiving element are brought to zero and then performing the next scan cycle. An equivalent circuit diagram for a two-dimensional contact image sensor that can be used to implement this approach is shown in FIG. 8.

The conventional two-dimensional contact image sensors have had the problem that in order to increase the sensing area, thereby providing more pixels, a greater number of shift registers and analog multiplexers must be used, leading to a higher production cost.

Furthermore, the conventional two-dimensional contact image sensors which provide reset TFTs for eliminating the residual charges have had the problem that the need for providing a reset TFT in each pixel makes it impossible to insure an adequate area for light reception, leading to a lower sensitivity and resolution, as well as a lower yield in the manufacturing process.

In either type of methods adopted to eliminate the residual charges, transition from the "photo" to "dark" state is achieved by resetting charges and, hence, in the subsequent reading of the document in the "photo" state, the ratio of capacitance division dictates that charges are transferred to the capacities on the signal line side in a smaller amount than the charges actually stored in the photodiode, thereby lowering the dynamic range of the image sensor.

SUMMARY OF THE INVENTION

The present invention has been accomplished under these circumstances and has as an object providing a driving device and method for a two-dimensional contact image sensor that can be driven with a smaller number of drive ICs to obtain correct image signals even if the reading range is increased.

A driving device of the present invention for driving a two-dimensional contact image sensor comprising a plurality of pixel forming light-receiving elements that are arranged in a two-dimensional matrix in both main scanning and frame scan directions, charge transfer switching elements for respective pixels that are individually connected to said light-receiving elements and which transfer the charges generated in said light-receiving elements, gate lines that are common to said charge transfer switching elements for respective pixels in the main scanning direction, and data lines that are connected to said charge transfer switching elements for respective pixels and which are common thereto in the frame scan direction, carries out a plurality of pre-scans cycle on the same image without producing an output image signal and, thereafter, scans the image to produce an output image signal.

A method for driving a two-dimensional contact image sensor comprising a plurality of pixel forming light-receiving elements that are arranged in a two-dimensional matrix in both main scanning and frame scan directions, charge transfer switching elements for respective pixels that are individually connected to the light-receiving elements and which transfer the charges generated in the light-receiving elements, gate lines that are common to the charge transfer switching elements for respective pixels in the main scanning direction, and data lines that are connected to the charge transfer switching elements for respective pixels and which are common thereto in the frame scan direction comprises the steps of carrying out a plurality of pre-scan cycles on the same image without producing an output image signal and, thereafter, scanning the image in such a way as to produce an output image signal.

In the device and method, according to the invention, for driving a two-dimensional contact image sensor comprising a plurality of pixel forming light-receiving elements that are arranged in a matrix in both main scanning and frame scan directions and charge transfer switching elements for respective pixels that are individually connected to the light-receiving elements, a plurality of pre-scan cycles is carried out on the same image without producing an output image signal and, thereafter, the image is scanned in such a way as to produce an output image signal. Because of this operational feature, imagelags that would otherwise occur in the frame scan direction are eliminated to enable the production of correct output image signals.

BRIEF DESCRIPTION OF THE DRAWINGS

FIG. 10 is a timing chart of the circuit shown in FIG. 9; and

FIG. 11 is a detail timing chart showing the timing of the dotted part of FIG. 10.

DESCRIPTION OF PREFERRED EMBODIMENTS

Embodiments of the present invention are described below with reference to accompanying drawings.

Figure 1:
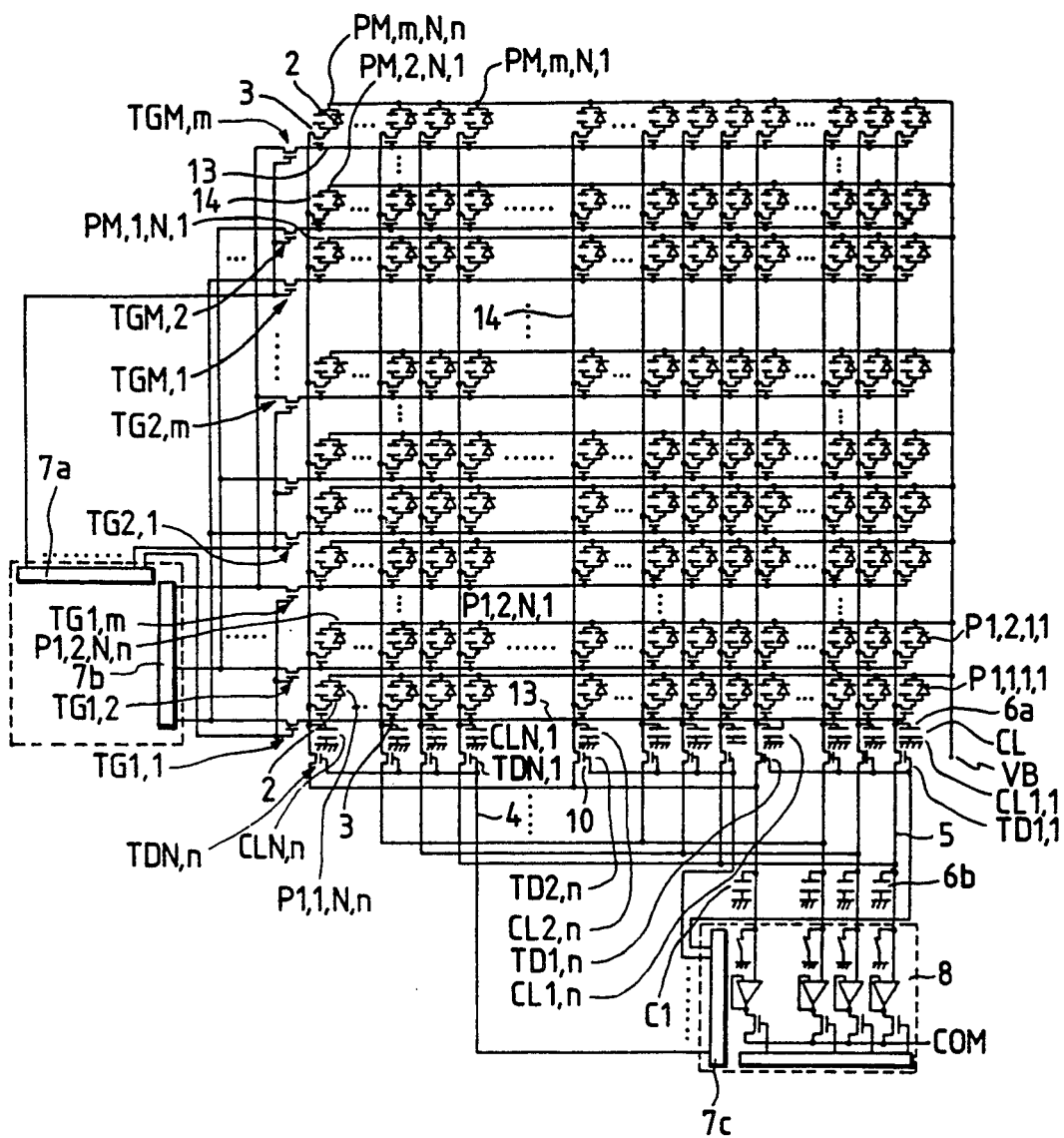
FIG. 1 is an equivalent circuit diagram for a two-dimensional contact image sensor according to an embodiment of the present invention.
Figure 2:
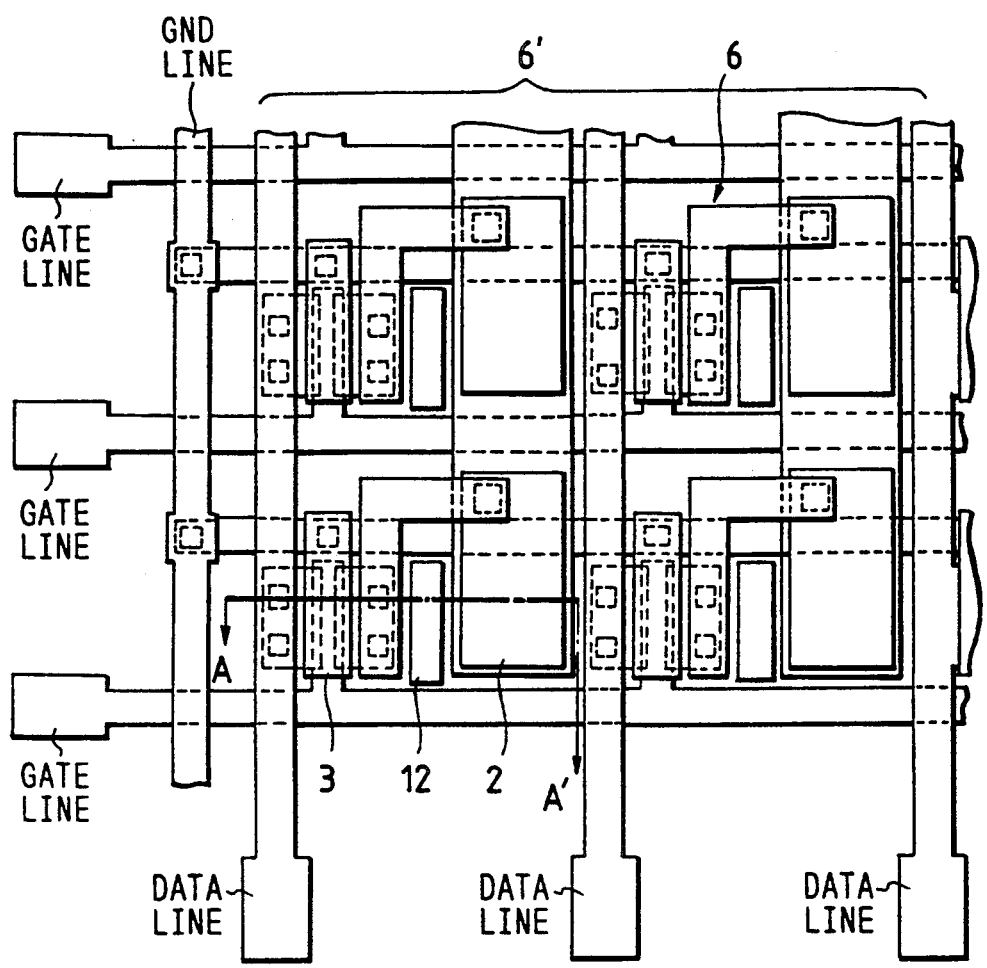
FIG. 2 is a schematic plan view showing part of the sensing area of the image sensor shown in FIG. 1.

FIG. 1 is an equivalent circuit diagram for a two-dimensional contact image sensor according to an embodiment of the present invention. FIG. 2 is a schematic plan view showing part of the sensing area of the image sensor shown in FIG. 1, and FIG. 3 is a schematic cross section of FIG. 2 as taken on line A-A'.

As FIG. 1 shows, the two-dimensional contact image sensor according to the embodiment under discussion comprises a substrate 1 that is made of an insulator such as glass and which has a plurality of light-receiving elements arranged in the following manner: first, n light-receiving elements (photodiodes) 2 formed in the main scanning direction compose a data block; N data blocks are arranged in the main scanning direction to form an array of light-receiving elements for a row; on the other hand, said arrays of light-receiving elements are disposed in m successive rows parallel to one another, thereby composing a gate block; M gate blocks are formed in the frame scan direction to compose the necessary number of light-receiving elements $P_{i,j,k,l}$ (i=1-M; j=1-m; k=1-N; l=1-n).

A further discussion is made about the plurality of light-receiving elements $P_{i,j,k,l}$ which are arranged in a two-dimensional matrix to compose the sensing area of the image sensor. A row consists of N blocks (data blocks) and one data block consists of n light-receiving elements. A column consists of M blocks (gate blocks) and one gate block consists of m light-receiving elements. Hence, $P_{i,j,k,l}$ are light-receiving elements that are arranged in a two-dimensional matrix consisting of (M×m) rows and (N×n) columns.

Figure 3:
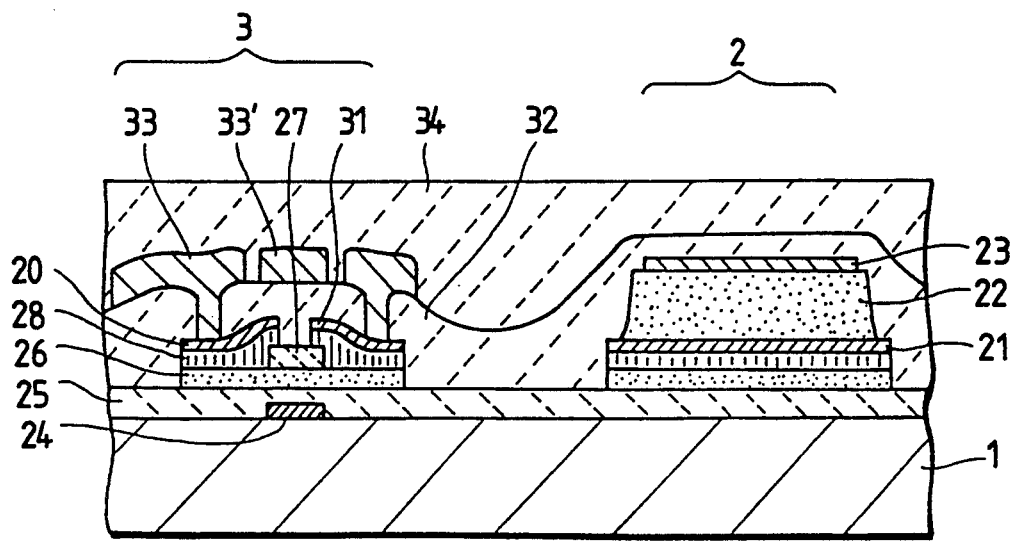
FIG. 3 is a schematic cross section of FIG. 2 as taken on line A-A'.

As shown in FIGS. 1, 2 and 3, each sensor portion (pixel) is composed of a light-receiving element 2 which is photoelectric transducer, namely, $P_{i,j,k,l}$ (i=1-M; j=1-m; k=1-N; l=1-n), a thin-film transistor 3 which is a switching element, namely, $T_{i,j,k,l}$ (i=1-M; j=1-m; k=1-N; l=1-n), and a lighting portion 12.

The transparent electrode 23 of the light-receiving element 2 is connected to the drain electrode 30 of the thin-film transistor 3 which transfers charges for each pixel; the gate electrode 24 of the thin-film transistor 3 is connected to a gate line 13 that is common to different rows Whereas the source electrode 31 is connected to a data line 14 that is common to different columns.

Each gate line 13 is connected to the source electrode of a gate block selecting thin-film transistor 9, namely, $TG_{i,j}$ (i=1~M; j=1~m) and the drain electrode of the gate block selecting thin-film transistor 9 is connected to a gate selecting shift register 7b via one of m common wires that are associated with assigned numbers in a selected gate block. In other words, the wires connected to the gate selecting shift register 7b have such a structure as to form a multi-level wiring in a matrix. The gate electrode of each gate block selecting thin-film transistor 9 is connected to a gate block selecting shift register 7a via common wires for respective gate blocks.

The respective data lines 14 have load capacities 6a, namely, $CL_{k,l}$ (k=1-N; l=1-n), formed on the side of an analog multiplexer 8; the load capacities 6a consist of N blocks, each block consisting of n capacities. These load capacities 6a are provided to store the charges that were generated in light-receiving elements arranged in the column direction and which have been transferred to said capacities via the associated data lines.

The terminating end of each data line 14 is connected to the drain electrode of a data block selecting thin-film transistor 10 namely, $TD_{k,l}$ (k=1~N; l=1~n) and the source electrode of the thin-film transistor 10 is connected to the multi-level wiring 4 in a matrix, which in turn is connected to n common signal lines 5 that are associated with assigned numbers in a selected data block. Each common signal line 5 is provided with a capacity 6b, namely, Cl (l=1~n) and the respective common signal lines are connected to the analog multiplexer 8 which has n analog switches for reading charges.

The gate electrode of each data block selecting thin-film transistor 10 is connected to a data block selecting shift register 7c via a wire that is common for a given data block. Crosses of the multi-level wiring 4 in a matrix are each provided with a shield member for preventing crosstalks.

The specific construction of the light-receiving element and the thin-film transistor in each sensor portion is described below with reference to FIG. 2 which is a schematic plan view of the sensing area and FIG. 3 which is a schematic cross section of FIG. 2 taken on line A-A'. It should be noted here that the block selecting thin-film transistors are constructed in the same manner as the thin-film transistors in the sensor portions.

As shown in FIG. 2, the interior of one pixel is composed of a light-receiving element 2 as a photoelectric transducer, a thin-film transistor (TFT) 3 as a charge transfer switching element, and a lighting portion 12 for admitting light from the rear side of the substrate 1.

As FIG. 3 shows in cross section, the light-receiving element 2 has a sandwich structure on the insulating substrate 1 such as glass and it is formed by depositing silicon nitride (SiNx), hydrogenated amorphous silicon (a-Si:H) and n+ hydrogenated amorphous silicon (n+ a-Si:H) in superposition, which in turn are overlaid, in the order written, with a metal electrode 21 typically made of chromium (Cr) which serves as a lower common electrode, a photoconductive layer 22 that is typically made of hydrogenated amorphous silicon of p-i-n type (pin a-Si:H) and which is segmented for each light-receiving element, and an upper transparent electrode 23 that is typically made of indium tin oxide (ITO) and which is similarly segmented.

As is clear from FIG. 2, the lower metal electrode 21 is formed continuously in the column direction and on that metal electrode 21 is formed photoconductive layer 22 which is segmented in a discrete manner, with upper transparent electrode 23 being similarly segmented to form discrete electrodes.

The structure of the thin-film transistor 3 is also shown specifically in FIG. 3 and it is a reverse staggered transistor that has the following layers formed, in the order written, in superposition on the substrate 1; a chromium (Cr1) layer as a gate electrode 24; a silicon nitride film (SiNx) as a gate insulating layer 25; an a-Si:H layer as a semiconductor active layer 26; a silicon nitride film as a top insulating layer 27 that is provided to face the gate electrode 24; an n+ a-Si:H layer as an ohmic contact layer 28; chromium (Cr2) layers as a drain electrode 30 and a source electrode 31; a polyimide layer 32 as an insulating layer; and a wiring layer 33 or an aluminum (Al) light-shielding layer 33' that is positioned above the top insulating layer 27 to shield the a-Si:H layer from light.

The process for fabricating the image sensor according to the embodiment under consideration is described below.

First, Cr1 is deposited on the transparent substrate 1 such as glass to give a film thickness of 500–1,000 angstroms by dc magnetron sputtering and the deposited film is etched photolithographically in a predetermined pattern to form the gate electrode 24 of a thin-film transistor. Then, SiNx forming the gate insulating layer 25, a-Si:H forming the semiconductor layer 26 and SiNx forming the top insulating layer 27 are superposed in the order written by plasma-assisted CVD to give respective film thicknesses of several thousand angstroms, 500-1,000 angstroms and several thousand angstroms, and the upper SiNx layer is etched in a predetermined pattern to form the top insulating layer 27.

Thereafter, n+ a-Si:H forming the ohmic contact layer 28 is deposited to give a film thickness of several thousand angstroms; then, Cr2 forming the drain electrode 30 and source electrode 31 of TFT and the metal electrode 21 of light-receiving element is deposited by dc magnetron sputtering to give a film thickness of several thousand angstroms. The layers of Cr2 and n+ a-Si:H are etched successively in predetermined patterns to form the metal electrode 21, drain electrode 30 and source electrode 31.

Then, in order to form the photoconductive layer 22, a p-type a-Si:H layer (several hundred angstroms), an i-type A-Si:H layer (several hundred to several thousand angstroms) and an n-type a-Si:H layer (several hundred angstroms) are deposited successively by plasma-assisted CVD using $SiH_4/B_2H_6$ gas, $SiH_4$ gas, and $SiH_4/PH_3$ gas, respectively. Over those a-Si:H layers, ITO forming the transparent electrode 23 is formed by dc magnetron sputtering to give a film thickness of several angstroms. The ITO layer and the pin a-Si:H layer are etched photolithographically in predetermined patterns to form the transparent electrode 23 and the photoconductive layer 22.

Subsequently, the polyimide layer 32 as the insulating layer is coated and patterned and aluminum (Al) forming the wiring layer 33 and the light-shielding layer 33' is deposited in a thickness of several microns by dc magnetron sputtering and the deposited film is etched photolithographically in a desired pattern. The patterned Al film is either overlaid with a transparent protective layer 34 or cemented with a thin glass plate to complete the main body of an image sensor.

In the above-described process of fabricating light-receiving elements and charge transfer TFTs for individual pixels, gate block selecting thin-film transistors 9 and data block selecting thin-film transistors 10, as well as those portions of the multi-level wiring which are connected to shift registers 7a and 7b and the portion of multi-level wiring 4 connected to shift register 7c are also to be formed on the substrate 1.

Finally, an analog multiplexer and the shift registers are mounted on a substrate, which may be the same or different from the substrate for the main body of image sensor, to fabricate a drive circuit. This step completes the process of manufacturing a two-dimensional contact image sensor according to the embodiment under discussion.

Next, the method of driving this two-dimensional contact image sensor is described in detail with reference to the equivalent circuit diagram shown in FIG. 1.

Light from a light source (not shown) is admitted through the lighting portion 12 to illuminate the surface of a document (not shown); when the light reflected from the document surface is incident on a certain light-receiving element 2, charges are generated in that element in an amount that corresponds to the intensity of its illumination and they are stored in its parasitic capacitance and the like.

Pulses of a given voltage R1 are applied at the gate line selecting shift register 7b for a predetermined time period whereas gate pulses G1 are applied at the gate block selecting shift register 7a; as a result, the first gate block of gate block selecting thin-film transistors 9 which consist of TG1,1-TG1,m are turned on. While the first gate block contains m gate lines, pulses $\phi R1$ are applied only to TG1,1 which is the gate block selecting thin-film transistor on the first gate line and, hence, thin-film transistors T1,1,1,1 -T1,1,N,n which are pixel forming charge transfer TFTs that are in the first row of the first gate block are turned on. As a result, the charges that were generated in photodiodes P1,1,1,1 -P1,1,N,n and which stored in their parasitic capacities and the like will be transferred via data lines 14 to load capacities CL1,1-CLN,n.

In the next step, when gate pulses $\phi D1$ are applied at the shift register 7c, data block selecting thin-film transistors TD1,1-TD1,n which comprise the first data block of data block selecting TFTs 10 are turned on, whereupon the charges that have been transferred to load capacities 6a (CL1,1-CL1,n) are forwarded via the multi-level wiring 4 to the load capacities 6b (C1-Cn) on the common signal lines 5.

In response to the charges stored in the load capacities 6b (C1-Cn), the potentials of common signal lines 5 will vary and the resulting voltage values are read by sequentially turning on switches SW1-SWn in the analog multiplexer 8, from which they are delivered to an output line (COM). Thereafter, the residual charges are reset. When the reading of charges from the first data block ends, gate pulses $\phi GD2$ - $\phi GDN$ are sequentially applied at the shift register 7c so as to read charges from the second to the Nth data blocks. These procedures complete the process of reading from the first row of the first gate block.

In the next step, pulses $\phi R2$ -$\phi Rm$ are applied sequentially at the shift register 7b and in synchronism with the application of those pulses, a gate pulse $\phi G1$ is applied at the shift register 7a; as a result, gate block selecting thin-film transistors TG1,2-TG1,n which are in the second to the mth rows of the first gate block are sequentially turned on for successive rows and the charges that have been stored in the parasitic capacitances and the like of light-receiving elements are transferred to load capacities 6a (CL,1 - CL1,n); at the same time, gate pulses $\phi D1$ - $\phi DN$ are applied sequentially at the shift register 7c, whereby the transferred charges are read into the analog multiplexer 8 for each block. These procedures complete the process of reading from the first gate block.

Then, the second gate block is selected and with gate lines in that block being selected sequentially, the charges generated in associated light-receiving elements are sequentially read into the analog multiplexer for each data block, thereby completing the process of reading from the second gate block. In the same manner, reading is performed for the third to the Mth gate blocks until the image sensor completes the process of reading over the full range. The image sensor according to the embodiment under discussion can be driven with three shift registers that perform on/off control over a plurality of thin-film transistors and with only one analog multiplexer that will produce output image signals.

In the two-dimensional contact image sensor according to the embodiment, a data block is composed of plural data lines 14 and each data line 14 is provided with load capacities 6a and data block selecting thin-film transistors 10, with individual data lines 14 being connected via the multi-level wiring 4 to common signal lines 5 which are provided with load capacities 6b. Because of this structural feature, the charges generated in light-receiving elements 2 can be sequentially read in data blocks from the common signal lines 5 using a single analog multiplexer 8; therefore, the number of analog multiplexers 8 can be markedly reduced even if the reading area is increased and this contributes to a lower manufacturing cost.

In the two-dimensional contact image sensor according to the embodiment, a gate block is also composed of plural gate line 13 and each gate line 13 is provided with gate block selecting thin-film transistors 9. The image sensor is also provided with the gate block selecting shift register 7a for controlling the thin-film transistors 9 and the gate line selecting shift register 7b which supplies pulses of a given voltage $\phi R1$ to the gate lines 13 via the thin-film transistors 9. This structural feature enables the user to select gate blocks sequentially and to turn on and off the pixel forming charge transfer TFTs 3 for each row via the gate lines 13 in the selected gate block; therefore, the number of shift registers for controlling the charge transfer TFTs 3 can be markedly reduced even if the reading area is increased and this contributes to a lower manufacturing cost.

The image sensor under discussion is also characterized by a smaller number of wire bonds provided to connect terminals on shift registers 7a, 7b and 7c and analog multiplexer 8 to wires and this offers the advantage of improving the reliability of the image sensor.

In the two-dimensional contact image sensor of the embodiment under discussion, both the gate lines 13 and the data lines 14 are divided in a plurality of blocks; it should, however, be noted that either the gate or data lines may be divided in blocks and, even in that case, a plurality of block selecting thin-film transistors are combined with the multi-layered wiring in a matrix and this offers the advantage of reducing the necessary number of drive ICs and, hence, the manufacturing cost.

In the embodiment under consideration, light-receiving elements of a sandwich type and charge transfer TFTs of a reverse staggered type are used; it should, however, be noted that two diodes may be connected in series in opposite polarity, one of which is a photodiode (PD) for light-receiving element while the other is a blocking diode (BD), in such a way that pulses are applied from the shift register to the BD, thereby transferring the charges generated in the PD.

Another embodiment of the present invention is described below with reference to accompanying drawings.

Figure 5:
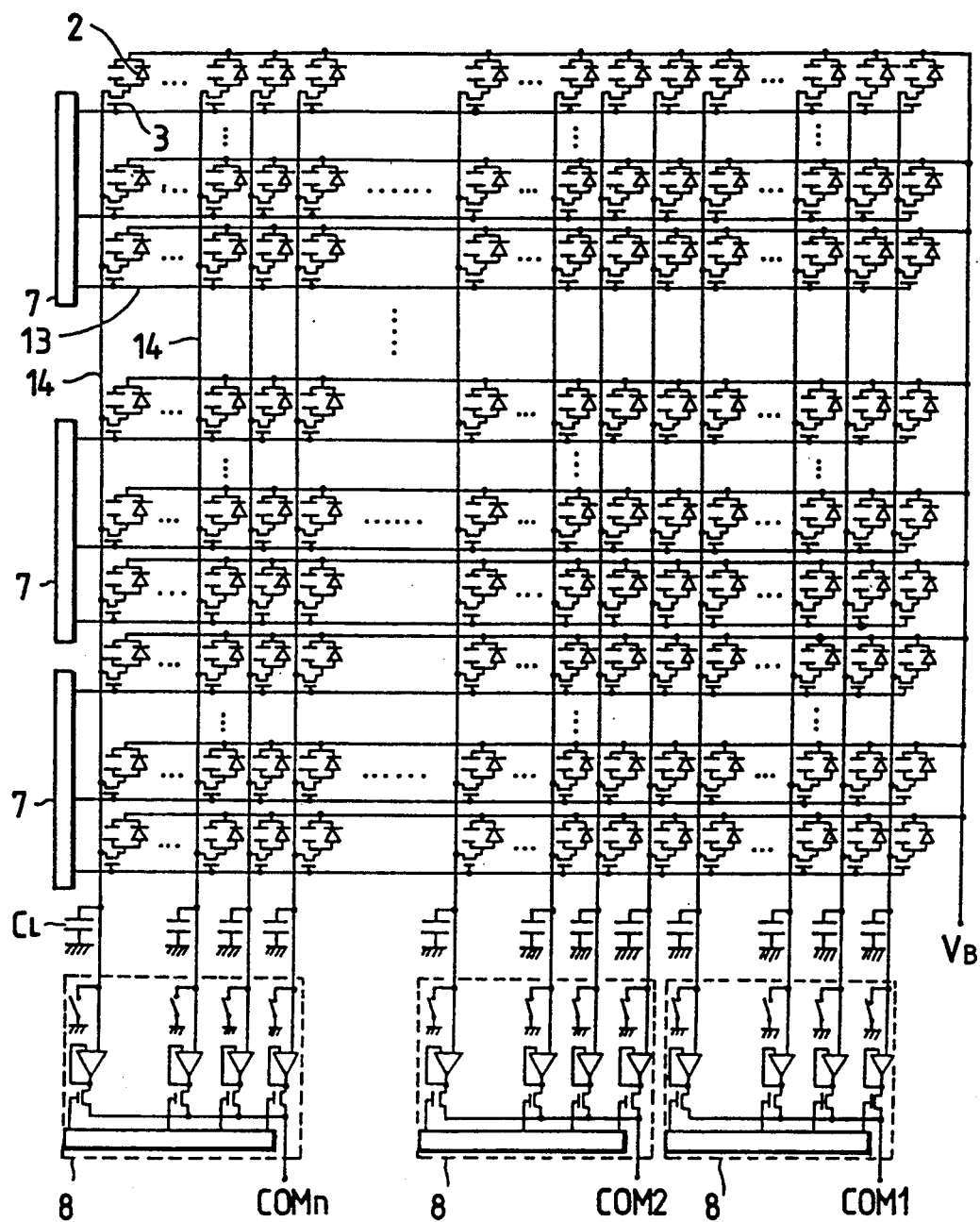
FIG. 5 is an equivalent circuit diagram of a conventional two-dimensional contact image sensor.
Figure 6:
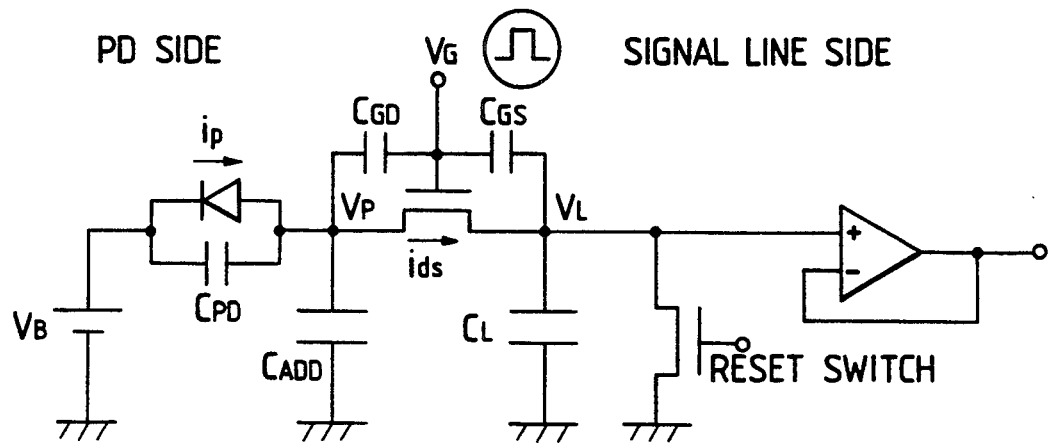
FIG. 6 is an equivalent circuit diagram for one pixel in the conventional two-dimensional contact image sensor.
Figure 7:
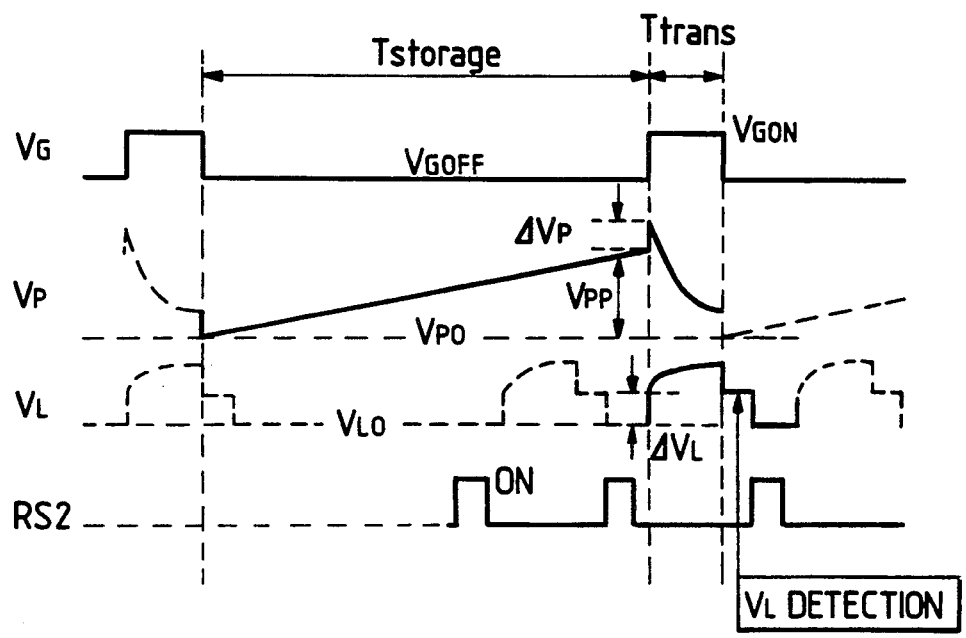
FIG. 7 is a timing chart for photodetection from one pixel in the conventional two-dimensional contact image sensor.
Figure 8:
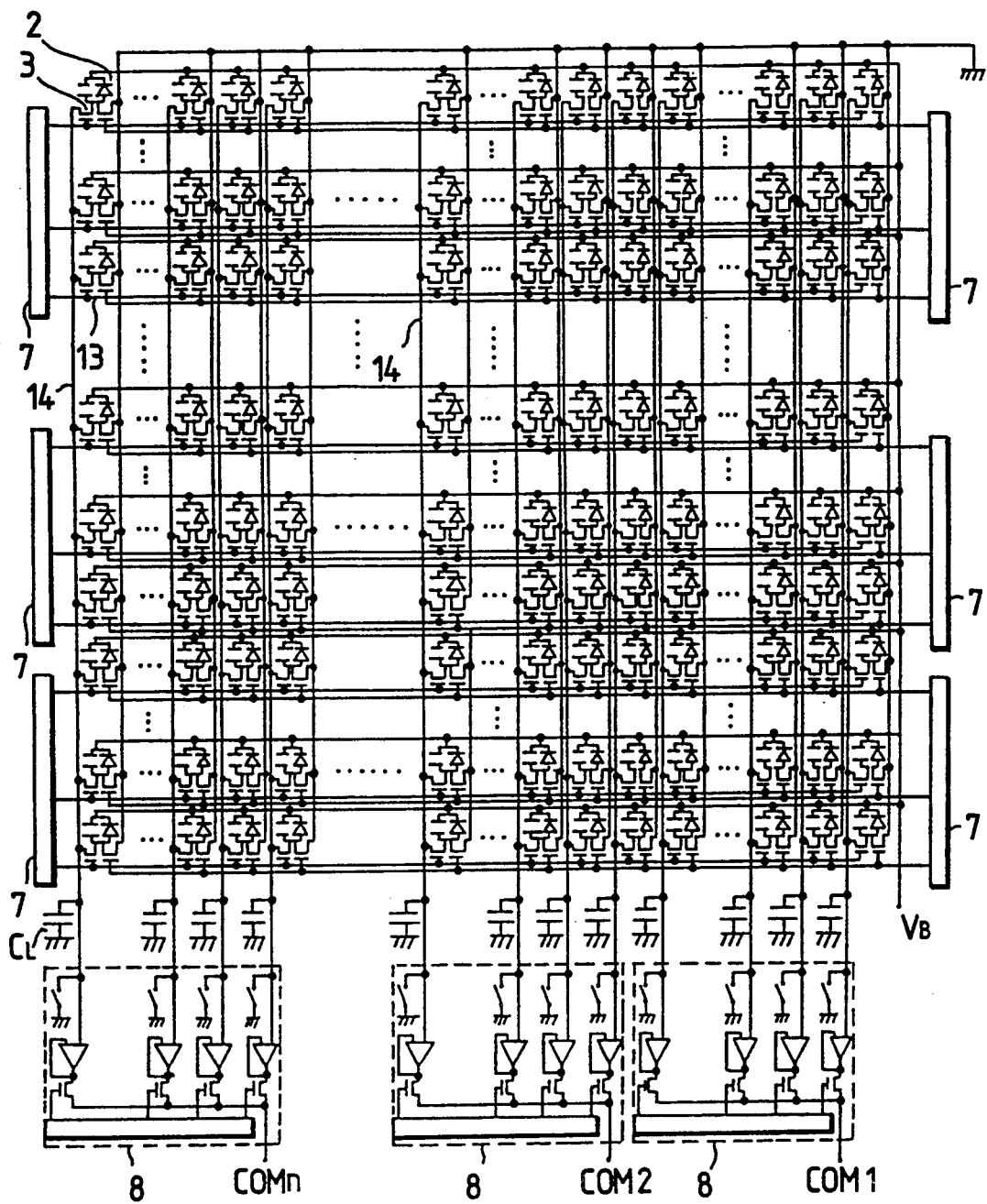
FIG. 8 is an equivalent circuit diagram of another conventional two-dimensional contact image sensor that is adapted to eliminate residual charges.

The two-dimensional contact image sensor of this second embodiment has basically the same construction as the conventional version shown in FIG. 5 and each of the sensor portions, as well as the light-receiving elements and thin-film transistors are composed in essentially the same manner as shown in FIGS. 2 and 3.

Figure 4:
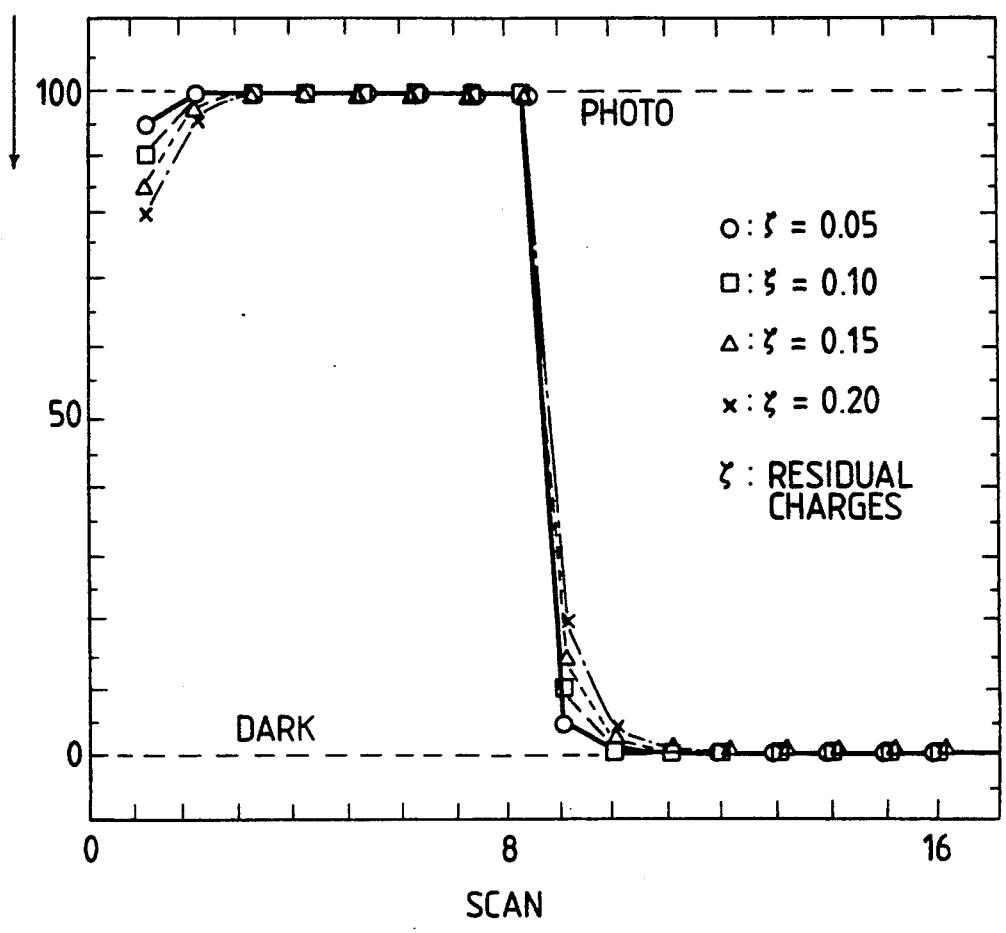
FIG. 4 is a graph showing how much of the charges generated in light-receiving elements are transferred to signal lines in another embodiment of the present invention.

FIG. 4 shows how the profile of residual charges varies with the ratio of capacitance division between light-receiving element and signal line. For the sake of simplicity, a case is assumed where 8 scan cycles in the "photo" state are followed by 8 scan cycles in the "dark" state and the proportion (in theoretical values) of charges transferred to the signal line is shown for varying ratios of capacitance division. In FIG. 4, $\zeta$ denotes the relative residual charges which are expressed by Eq. (10).

As FIG. 4 shows, when one scan cycle is performed in the "photo" state, the proportion of charges transferred to the signal line is determined by $\zeta$, and the greater the value of $\zeta$, the smaller the proportion of charges transferred to the signal line, producing the higher content of residual charges. However, if the second scan is successively performed, the proportion of charges transferred increases for each value of $\zeta$ and in the fourth and subsequent cycles, almost all charges are transferred in spite of the value of $\zeta$.

The same phenomenon is observed when scanning in the "photo" state is followed by scanning in the "dark" state; in the ninth scan (the first scan in the "dark" state), the effect of the residual charges that remain after the preceding scan is direct and the amount of charges to be transferred will not be reduced to zero; however, upon continued scanning and in the twelfth (fourth in the "dark" state) and subsequent cycles, the amount of charges to be transferred is reduced to almost zero without being affected by the ratio of capacitance division.

The two-dimensional contact image sensor according to the second embodiment described above has a capacitance of 1 pF on the side of light-receiving elements and a capacitance of 8 pF on the signal line side. In this case, the ratio of capacitance division is 88.89%, leaving 11.11% of charges behind on the side of light-receiving elements in the first scan. However, if one pre-scan cycle is carried out in such a way as to produce no output image signal before the successive second scan, the relative amount of residual charges is 1.23%; if two pre-scan cycles are carried out in such a way as to produce no output image signal before the third scan, the relative amount of residual charges is 0.14%; if three pre-scan cycles are performed in such a way as to produce no output image signal before the fourth scan, the relative amount of residual charges is 0.015%; if four pre-scan cycles are performed in such a way as to produce no output image signal before the fifth scan, the relative amount of residual charges is 0.0017%; and if five scan cycles are performed in such a way as to produce no output image signal before the sixth scan, the relative amount of residual charges is reduced to 0.00019%, which is substantially zero. Thus, almost all of the charges that were generated in light-receiving elements are transferred to signal lines.

In the above-described method of driving the image sensor according to the second embodiment, six scan cycles are performed on the same document and five of them are pre-scan cycles such that no output image signal is produced, with only the data in the sixth scan being delivered as an output image signal. This offers the advantage of substantially eliminating the adverse effect of imagelags that will be produced on account of the ratio of capacitance division, thereby enabling correct image reading.

Stated in more general terms, the method of driving the image sensor according to the invention performs plural scan cycle on the same image in such a way that only the data obtained in the last scan is read as an output, and this offers the advantage of substantially eliminating the imagelags that would otherwise occur in the frame scan direction, whereby all the charges generated in light-receiving elements can be transferred to signal lines so as to yield correct image signals.

The transfer of all the charges generated in light-receiving elements offers the additional advantage of increasing the dynamic range of the image sensor and improving the resolution of the image that can be obtained.

As a further advantage, TFTs for resetting residual charges need not be provided within individual pixels in the sensor portions and this helps insure sufficient light-receiving areas to prevent the decrease not only in sensitivity and resolution but also in the yield of image sensors to be manufactured.

Figure 9:
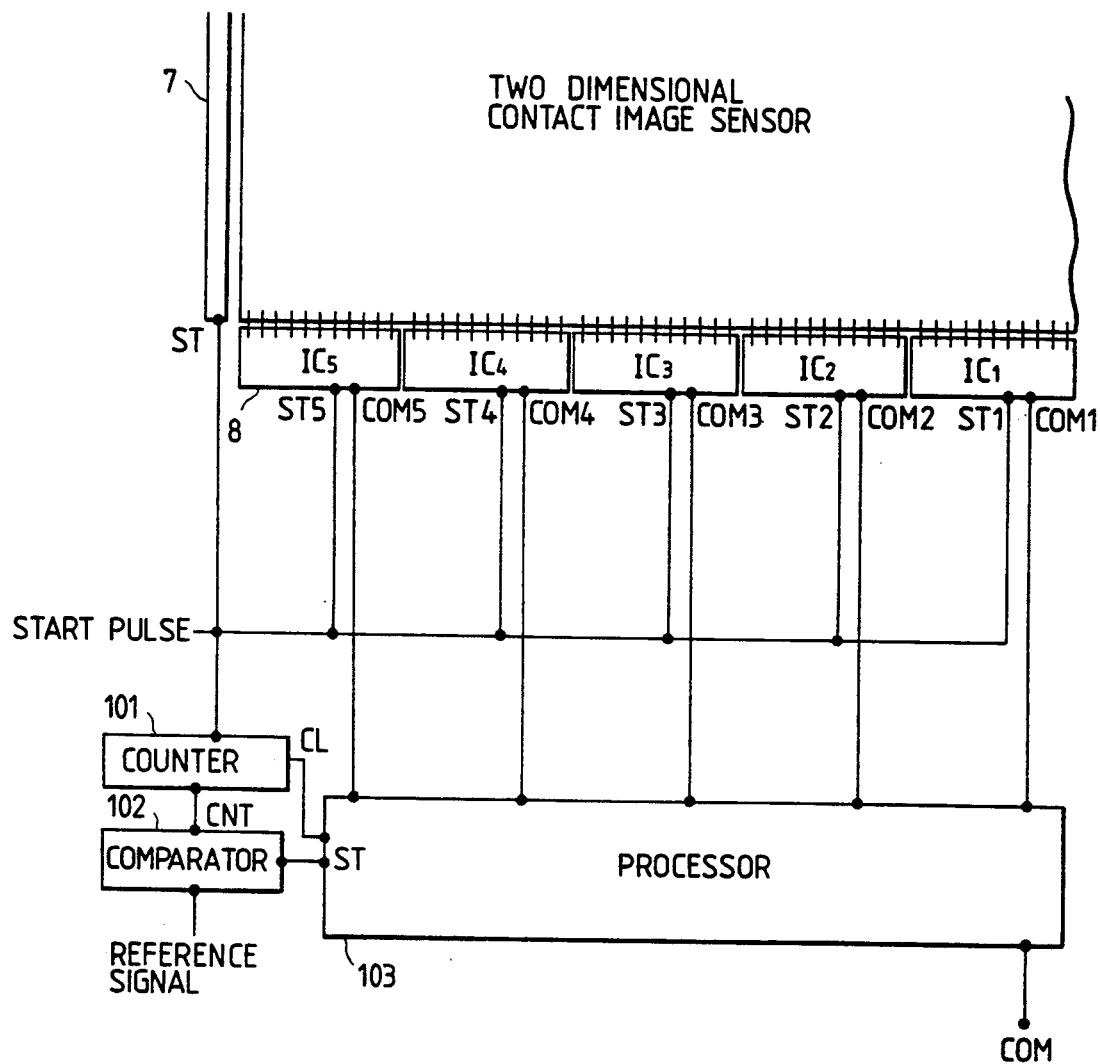
FIG. 9 is a circuit diagram of the scanning processing circuit to explain the prescann.

The processing circuit in the case of the prescanning is shown FIG. 9. This processing circuit is arranged to carry out three times of pre-scans, thereafter, the readout signal of the fourth scanning is output. In FIG. 9, references are assigned as same as those of FIG. 5. The processing circuit comprises a plurality of analog multiplexers 8, shift registers 7, a counter 101, a comparator 102, and a processor 103. The output lines COM1 to COM5 of the multiplexers labeled as IC1 to IC5 are connected to the processor 103 to apply the output signals of the multiplexers. The processor 103 outputs the readout signal as serial signal to a COM terminal. The start pulses generated by a start pulse generation unit (not shown) are applied to each of the multiplexers IC1 to IC5, the shift register 7, and the counter 101. The comparator 102 receives a counter signal from the counter 101 and a reference signal generated by a reference signal generation unit (not shown) so that a comparison result is applied to the processor 103. Additionally, the clock pulse signal is applied from the counter 101 to the processor 103. A timing chart of each signals in this processing circuit is shown in FIG. 10. In this figure, a pulse signal represented by Processor ST is input as a reference signal so that the readout signal is output to the COM at the fourth start pulse. FIG. 11 is a detailed timing chart showing the timing of dotted part of FIG. 10. In practical, the COM output signals are provided severally.

In the device and method, according to the invention, for driving a two-dimensional contact image sensor comprising a plurality of pixel forming light-receiving elements that are arranged in a matrix in both main scanning and frame scan directions and charge transfer switching elements for respective pixels that are individually connected to the light-receiving elements, a plurality of pre-scan cycles is carried out on the same image without producing an output image signal and, thereafter, the image is scanned in such a way as to produce an output image signal. Because of this operational feature, imagelags that would otherwise occur in the frame scan direction are eliminated to enable the production of correct output image signals.

What is claimed is:

1. A driving device for driving a two-dimensional contact image sensor comprising:
   a plurality of pixel forming light-receiving elements arranged in a two-dimensional matrix defined by a plurality of data blocks in a main scanning direction and a plurality of gate blocks in a frame scan direction for scanning an image by generating charges according to a sensed image;
   charge transfer switching elements for holding charges generated by a plurality of data blocks of said light-receiving elements;
   gate lines common to said charge transfer switching elements for respective pixels in the main scanning direction;
   data lines for individually connecting said charge transfer switching elements to said light receiving elements in the frame scan direction;
   output image signal means for outputting an output image signal according to the charges held in the charge transfer switching elements; and
   controlling means for scanning an image sensed by said light-receiving elements a plurality of times without producing an output image signal from said output image signal means and then scanning the sensed image to produce an output image signal from said output image signal means.

2. A driving device as claimed in claim 1, further comprising:
   gate block selecting means for selecting light-receiving elements along a selected gate line and for transferring the charges from said selected light-receiving elements to said charge transfer switching elements along their respective data lines.

3. A driving device as claimed in claim 1, said output image signal means including:
   load capacity means for holding charges received from a data block of said charge transfer switching elements;
   data block selecting means for selecting a data block from said charge transfer switching elements and for transferring the charge from said selected data block of said charge transfer switching elements to said load capacity means; and
   switching means for outputting an output image signal according to said load capacity means in a closed position.

4. A driving method for driving a two-dimensional contact image sensor comprising a plurality of pixel forming light-receiving elements arranged in a two-dimensional matrix defined by a plurality of data blocks in a main scanning direction and a plurality of gate blocks in a frame scan direction for scanning an image by generating charges according to a sensed image, charge transfer switching elements for holding charges generated by a plurality of data blocks of said light-receiving elements, gate lines for connecting said light receiving means in the main scanning direction, data lines for individually connecting said charge transfer switching elements to said light receiving elements in the frame scan direction, output image signal means for outputting an output image signal according to the charges held in the charge transfer switching elements, said driving method comprising the steps of:
   pre-scanning an image sensed by said light-receiving elements a plurality of times without producing an output image signal from said output image signal means; and
   scanning said sensed image in such a way as to produce an output image signal from said output image signal means.

* * * * *